(12) United States Patent
Kuo et al.

(10) Patent No.: US 9,948,839 B2
(45) Date of Patent: Apr. 17, 2018

(54) IMAGE SENSOR AND IMAGE CAPTURE DEVICE

(71) Applicant: VisEra Technologies Company Limited, Hsin-Chu (TW)

(72) Inventors: Wu-Cheng Kuo, Hsin-Chu (TW);
Kuo-Feng Lin, Kaohsiung (TW);
Chung-Hao Lin, Keelung (TW);
Yu-Kun Hsiao, Hsin-Chu (TW)

(73) Assignee: Visera Technologies Company Limited, Hsin-Chu (TW)

( * ) Notice: Subject to any disclaimer, the term of this patent is extended or adjusted under 35 U.S.C. 154(b) by 0 days.

(21) Appl. No.: 14/987,036

(22) Filed: Jan. 4, 2016

(65) Prior Publication Data
US 2017/0195532 A1 Jul. 6, 2017

(51) Int. Cl.
| | |
|---|---|
| *H04N 5/335* | (2011.01) |
| *H04N 5/225* | (2006.01) |
| *G02B 1/11* | (2015.01) |
| *G02B 3/00* | (2006.01) |
| *G02B 5/20* | (2006.01) |
| *G02B 6/293* | (2006.01) |

(52) U.S. Cl.
CPC ............. *H04N 5/2253* (2013.01); *G02B 1/11* (2013.01); *G02B 3/0056* (2013.01); *G02B 5/201* (2013.01); *G02B 6/29335* (2013.01); *H04N 5/2254* (2013.01)

(58) Field of Classification Search
CPC ........................... H04N 5/374–5/37457; H04N 2209/045–2209/046; H01L 27/14643–27/14663; H01L 27/14621; H01L 27/146–27/14893; H01L 27/14627; H01L 27/14629; H01L 27/1464

USPC ............. 348/308, 273–283; 250/208.1; 257/225–234, 257, 258, 291–294, 257/431–448
See application file for complete search history.

(56) References Cited

U.S. PATENT DOCUMENTS

2008/0061330 A1* 3/2008 Shiau ................ H01L 27/14687
257/294
2008/0142685 A1* 6/2008 Gazeley ............ H01L 27/14621
250/208.1
(Continued)

FOREIGN PATENT DOCUMENTS

| CN | 104516032 A | 4/2015 |
|---|---|---|
| JP | 2009-038352 A | 2/2009 |

(Continued)

OTHER PUBLICATIONS

An Office Action from corresponding JP Application No. 2016-102966 dated Mar. 28, 2017 is attached with an English translation; 21 pgs.

(Continued)

*Primary Examiner* — Xi Wang
(74) *Attorney, Agent, or Firm* — Muncy, Geissler, Olds & Lowe, P.C.

(57) ABSTRACT

An image sensor includes a sensing layer, a transparent plate, and a first guided-mode resonance structure. The sensing layer includes sensing units configured to sense a light beam. The transparent plate is located above the sensing layer. The first guided-mode resonance structure is disposed on a first area of the transparent plate, and blocks a first waveband of the light beam from passing through.

10 Claims, 7 Drawing Sheets

(56) References Cited

U.S. PATENT DOCUMENTS

| | | | | |
|---|---|---|---|---|
| 2012/0119068 A1* | 5/2012 | Numata | ............ | H01L 27/14621 |
| | | | | 250/208.1 |
| 2012/0212656 A1* | 8/2012 | Hiramoto | .......... | H01L 27/14621 |
| | | | | 348/294 |
| 2012/0229696 A1* | 9/2012 | Hashimoto | .............. | G02B 7/36 |
| | | | | 348/360 |
| 2015/0054103 A1* | 2/2015 | Mackey | ............ | H01L 27/14629 |
| | | | | 257/432 |

FOREIGN PATENT DOCUMENTS

| | | | |
|---|---|---|---|
| JP | 2010225944 | A | 10/2010 |
| JP | 2011013330 | A | 1/2011 |
| JP | 2012186488 | A | 9/2012 |
| JP | 2013068688 | A | 4/2013 |
| JP | 2014033052 | A | 2/2014 |
| JP | 2015-170638 | A | 9/2015 |
| JP | 2015194617 | A | 11/2015 |
| TW | 200920709 | A | 5/2009 |

OTHER PUBLICATIONS

An Office Action from corresponding TW Application No. 105105089 dated Feb. 15, 2017 is attached; 5 pgs.
An Office Action from corresponding JP Application No. 2016-102966 dated Aug. 8, 2017; 17 pgs.

\* cited by examiner

IMAGE SENSOR AND IMAGE CAPTURE DEVICE

BACKGROUND OF THE INVENTION

Field of the Invention

The present disclosure relates to an image sensor and an image capture device, and in particular to an image sensor and an image capture device having a guided-mode resonance structure.

Description of the Related Art

In general, a digital camera utilizes an image sensor to sense light and generate an image signal, and thus a picture taken by the digital camera can be generated according to the image signal. In addition, a spectrometer utilizes an image sensor to sense an infrared ray, ultraviolet light, and/or visible light.

As image sensors continue to develop, high-quality image signals are increasingly required. The image sensors using a backside illumination (BSI) technology having light-pipe structures to guide light to photodiodes. The image sensors have better photosensitivity and image quality.

Although image sensors have been generally adequate for their intended purposes, they have not been entirely satisfactory in all respects. Consequently, it is desirable to provide a solution for the problem of how to improve image sensors.

BRIEF SUMMARY OF THE INVENTION

The present disclosure provides image sensors for decreasing the manufacturing cost of image sensors, or combining multiple functions.

The present disclosure provides an image sensor including a sensing layer, a transparent plate, and a first guided-mode resonance structure. The sensing layer includes sensing units configured to sense a light beam. The transparent plate is located above the sensing layer. The first guided-mode resonance structure is disposed on a first area of the transparent plate, and blocks a first waveband of the light beam from passing through.

In some embodiments, the image sensor further includes a second guided-mode resonance structure disposed on a second area of the transparent plate, blocking a second waveband of the light beam from passing through.

In some embodiments, the image sensor further includes an anti-reflection layer disposed on a clear area of the transparent plate.

In some embodiments, the image sensor further includes a top color filter unit disposed on a color filter area of the transparent plate.

In some embodiments, the image sensor further includes a plurality of color filter units disposed on the sensing layer, under the first area of the transparent plate.

The present disclosure provides an image capture device including a sensor housing, a sensing structure, and a protection structure. The sensor housing includes a receiving chamber, and an opening communicating with the receiving chamber. The sensing structure is disposed in the receiving chamber, and includes a sensing layer.

The sensing layer includes sensing units configured to sense a light beam. The protection structure includes a transparent plate and a first guided-mode resonance structure. The transparent plate covers the opening, and is located above the sensing structure. The first guided-mode resonance structure is disposed on a first area of the transparent plate, and blocks a first waveband of the light beam from passing through.

In conclusion, because of the structure of the guided-mode resonance structure, the color filter units disposed on the sensing layer can be omitted. Therefore, the manufacturing cost of the sensing structure is decreased and the structure of the sensing structure can be simplified. In addition, thanks to the guided-mode resonance structure and the top color filter unit, the image sensor can be designed to perform multiple functions, such as both image capture and gesture detection.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
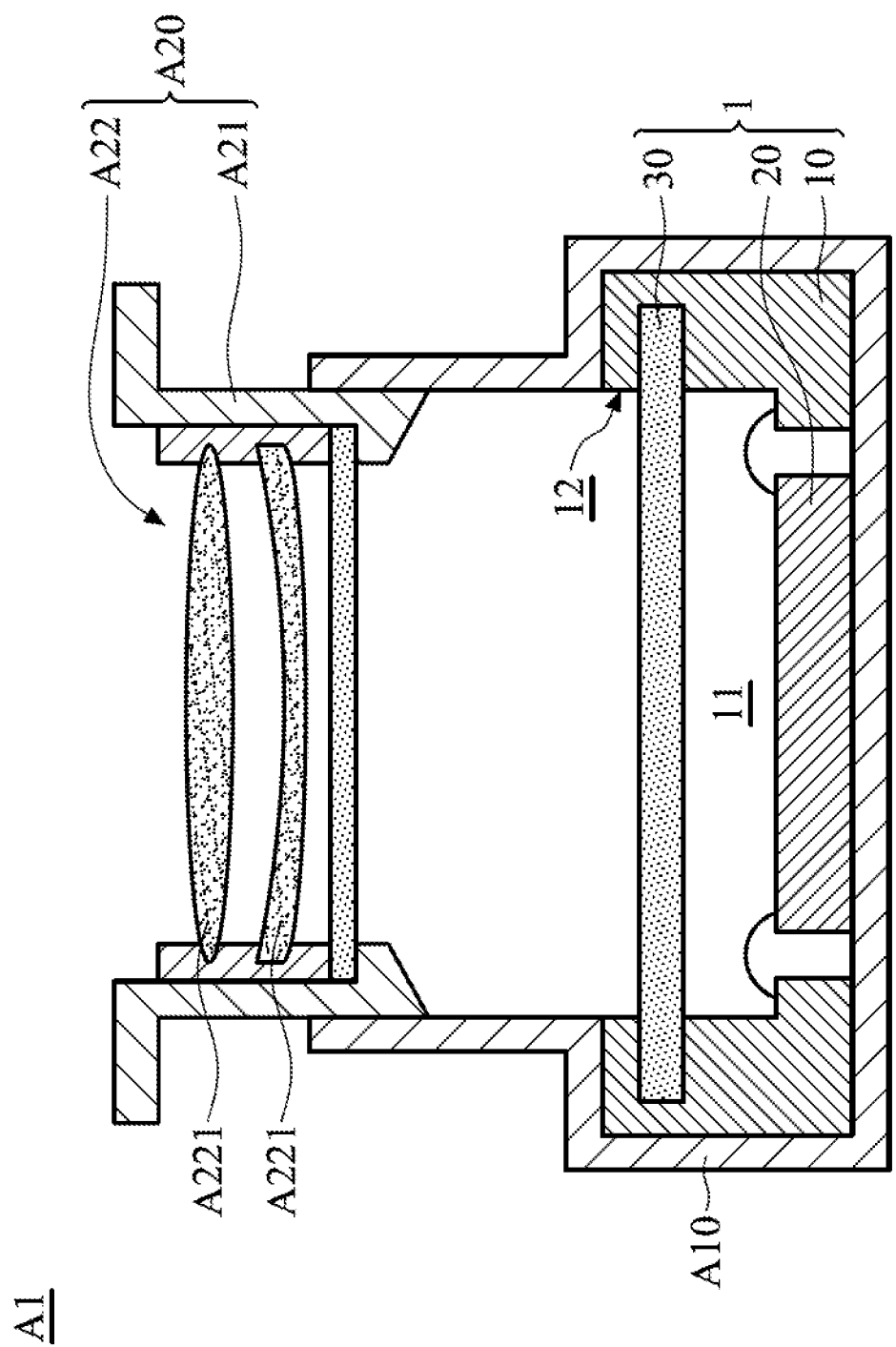
FIG. 1 is a schematic view of an image capture device in accordance with some embodiments of the present disclosure.

The following disclosure provides many different embodiments, or examples, for implementing different features of the present disclosure. Specific examples of components and arrangements are described below to simplify the present disclosure. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Furthermore, the shape, size, and thickness in the drawings may not be drawn to scale, or the drawings may be otherwise simplified for clarity of discussion, as they are intended merely for illustration.

FIG. 1 is a schematic view of an image capture device A1 in accordance with some embodiments of the present disclosure. In some embodiments, the image capture device A1 is spectrometer, gesture detector, or TOF (Time of Flight) detector. In some embodiments, the image capture device A1 is an electronic device with a photographic function. In some embodiments, the image capture device A1 is an imaging module with a photographic function disposed in an electronic device, such as a mobile phone, or a computer.

The image capture device A1 includes a casing A10, a camera lens A20, and an image sensor 1. The camera lens A20 is disposed on the casing A10, and the image sensor 1 is disposed in the casing A10. The camera lens A20 includes a lens housing A21 and a lens assembly A22. The lens housing A21 is disposed on the sensor housing 10. In some embodiments, the lens housing A21 is moveable relative to the sensor housing 10.

The lens assembly A22 is disposed in the lens housing A21. The lens assembly A22 includes one or more lenses A221. The lenses A221 are configured to focus a light beam on the image sensor 1.

The image sensor 1 is configured to capture an image. In some embodiments, the image sensor 1 is a CMOS (Complementary Metal-Oxide-Semiconductor) image sensor. In some embodiments, the image sensor 1 is a FSI (Frontside illumination) or BSI (backside illumination) CMOS image sensor, or another suitable sensor.

The image sensor 1 includes a sensor housing 10, a sensing structure 20, and a protection structure 30. The sensor housing 10 includes a receiving chamber 11 and an opening 12 communicating with the receiving chamber 11.

The sensing structure 20 is disposed in the receiving chamber 11. The sensing structure 20 is configured to detect an incident light beam and generate an image signal according to the light beam falling on the sensing structure 20. An image is generated according to the image signal.

The protection structure 30 covers and is connected to the opening 12. The protection structure 30 is configured to protect the sensing structure 20. In some embodiments, the protection structure 30 is a plate structure.

Figure 2:
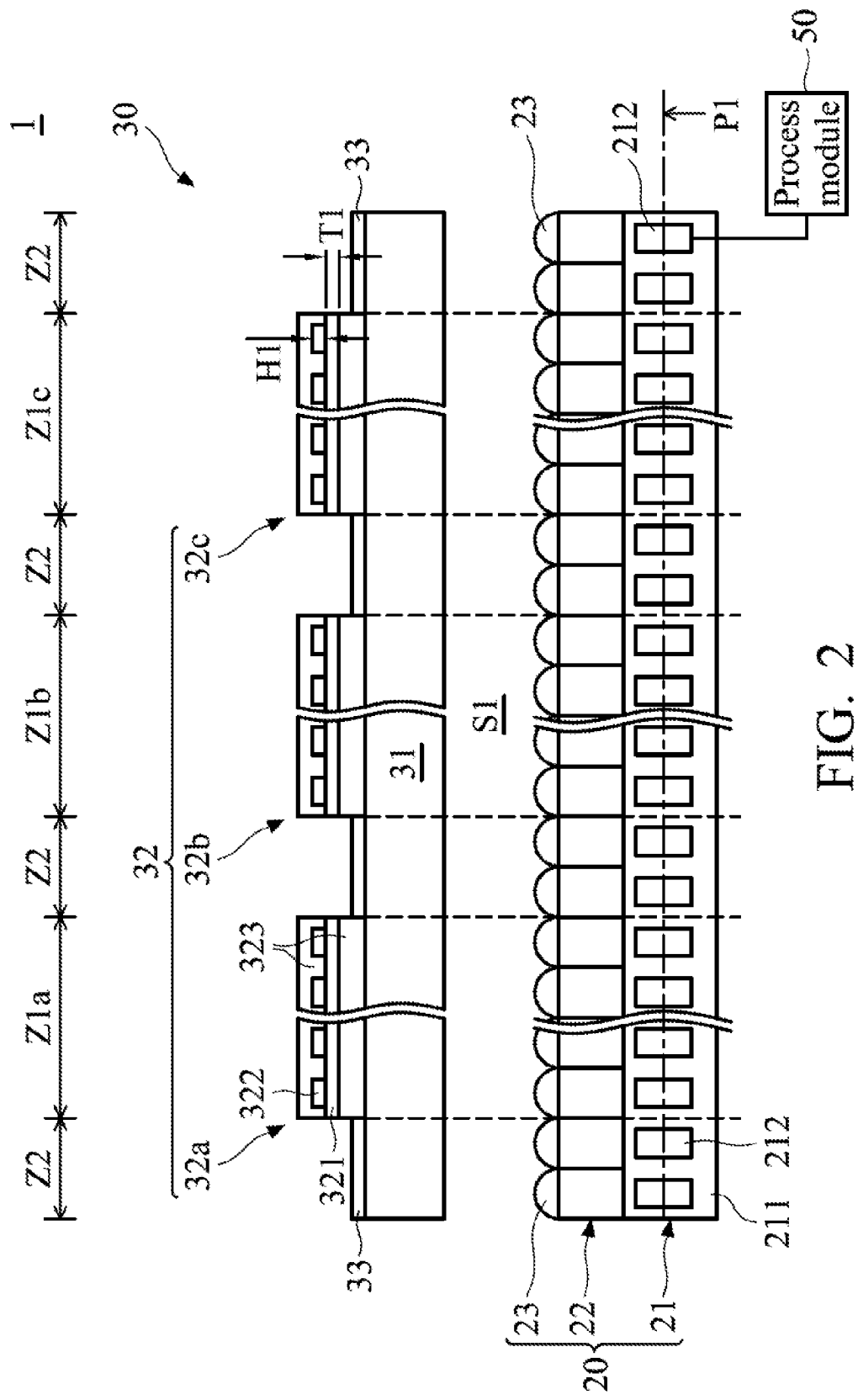
FIG. 2 is a schematic view of the image sensor in accordance with some embodiments of the present disclosure.
Figure 3:
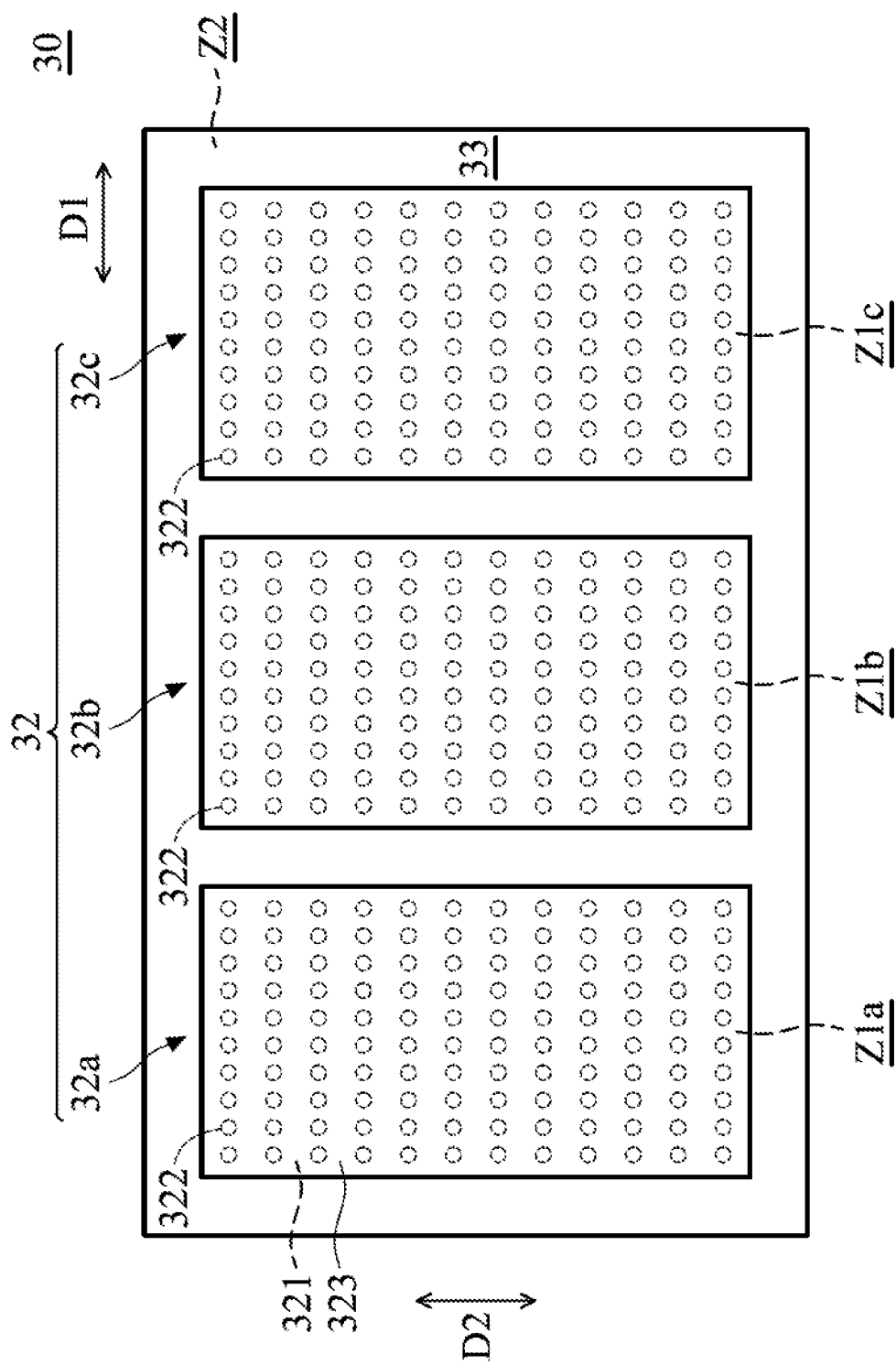
FIG. 3 is a schematic view of a portion of a protection structure in accordance with some embodiments of the present disclosure.

FIG. 2 is a schematic view of the image sensor 1 in accordance with some embodiments of the present disclosure. FIG. 3 is a schematic view of a portion of a protection structure 30 in accordance with some embodiments of the present disclosure.

The sensing structure 20 includes a sensing layer 21, a flat layer 22, and microlenses 23. The sensing layer 21 extends along a reference plane P1. The sensing layer 21 is configured to detect an incident light beam and converts to electronic signal according to the light beam falling on the sensing layer 21.

The sensing layer 21 may include all of the following elements, but the sensing layer 21 does not necessarily include all of the following elements, as long as the objective of the sensing layer 21 is achieved. The sensing layer 21 includes a substrate 211 and sensing units 212. In some embodiments, the sensing layer 21 also includes other optional layers, such as a dielectric layer or an anti-reflection layer (not shown in figures).

The sensing units 212 are disposed in the substrate 211. The sensing units 212 are arranged in a sensing array along the reference plane P1. In some embodiments, the sensing units 212 are photodiodes. Each of the sensing units 212 is configured to sense a light beam and generate an intensity signal according to the intensity of the light beam falling thereon. The image signal is formed by the intensity signals.

The flat layer 22 is disposed on the sensing layer 21. The flat layer 22 is configured to keep the distance between the sensing units 212 and the microlenses 23. In some embodiments, the flat layer 22 is a flat structure parallel to the reference plane P1. In some embodiments, the flat layer 22 is transparent. The flat layer 22 is made of photoresist or organic polymer or dielectric materials.

Each of the microlenses 23 is disposed on one of the sensing units 212. The microlenses 23 are arranged in a microlens array along a plane that is parallel to the reference plane P1. The microlenses 23 are configured to focus the light beam on the sensing units 212.

The protection structure 30 includes a transparent plate 31, guided-mode resonance structures 32, and an anti-reflection layer 33. The transparent plate 31 covers and is connected to the opening 12. The transparent plate 31 is configured to protect the sensing structure 20. In some embodiments, the transparent plate 31 is made of glass.

The transparent plate 31 is a plate structure parallel to the reference plane P1. In some embodiments, the transparent plate 31 is a lens, such as a convex lens or a concave lens.

The transparent plate 31 is disposed on the sensing structure 20. As shown in FIGS. 1 and 2, the transparent plate 31 is located above and separated from the sensing structure 20. In other words, an empty space Si is located between the protection structure 30 and the sensing structure 20.

The guided-mode resonance structure 32 includes a base layer 321, grating units 322, and a transparent material 323. The base layer 321 is disposed on the transparent plate 31, and extends parallel to the reference plane P1. The grating units 322 are disposed on the base layer 321.

In some embodiments, the grating units 322 are arranged along a plane that is parallel to the base layer 321 or the reference plane P1. The grating units 322 are cylinders, columns, angular pyramids, truncated pyramids, cones or truncated cones. The grating units 322 are arranged in a grating array. In some embodiments, the grating units 322 are arranged in a N×M matrix. The N and M are positive integer. In some embodiments, the N is equal to, greater than, or less than the M. In some embodiments, the N and M are greater than 10. For example, the N is 10 or greater, and the M is 10 or greater.

In some embodiments, the thickness T1 of the base layer 321 is in a range from about 0.1 nm to 30 nm. In some embodiments, the height H1 of the grating units 322 relative to the base layer 321 is in a range from about 30 nm to 100 nm. The width of the grating units 322 is in a range from about 120 nm to 260 nm.

The interval of two adjacent grating units 322 is in a range from about 100 nm to 260 nm. The pitch is defined as the width plus the interval, and the fill factor is defined as the width divided by the pitch. In some embodiments, the fill factor is in a range from about 0.2 to 0.8.

In some embodiments, the materials of the grating units 322 and the base layer 321 are the same, and formed as a single piece. The materials of the grating units 322 and the base layer 321 are organic photoresist or inorganic material. The grating units 322 and the base layer 321 include SiN, Si, relatively high refractive index photoresist (n>1.6), or a combination thereof.

The transparent material 323 is disposed on the base layer 321 and the grating units 322. As shown in FIG. 2, the transparent material 323 is also disposed between the transparent plate 31 and the base layer 321. The transparent material 323 is filled between the grating units 322.

In some embodiments, the transparent material 323 is organic photoresist or inorganic material. In some embodiments, the transparent material 323 includes SiO2, relatively low refractive index photoresist (n<1.5), or a combination thereof.

In some embodiments, the refractive index of the grating units 322 and the base layer 321 are greater than the refractive index of the transparent material 323. In some embodiments, the refractive index of the grating units 322 and the base layer 321 are in a range from about 1.6 to 2.5. The refractive index of the transparent material 323 is in a range from about 1.2 to 1.5.

Due to the structure of the guided-mode resonance structure 32 as described above, the guided-mode resonance structure 32 provides a guided-mode resonance effect. The guided-mode resonance structure 32 blocks a predetermined range of wavelengths of the light beam from passing through (or to the sensing structure 20).

For example, as shown in FIGS. 2 and 3, the guided-mode resonance structure 32 includes guided-mode resonance structure 32a, 32b, and 32c. In some embodiments, there are a lot of guided-mode resonance structures 32a, guided-mode resonance structures 32b, and guided-mode resonance structures 32c arranged in an array. Some of the guided-mode resonance structures 32a, 32b, and 32c are alternately arranged along an arrangement direction D1.

As shown in FIGS. 2 and 3, the adjacent guided-mode resonance structures 32a, 32b, and 32c correspond to a pixel of the image generated by a process module 50 according to the intensity signals. The anti-reflection layer 33 is surrounding the guided-mode resonance structures 32a, 32b, and 32c.

The guided-mode resonance structure 32a is disposed on an area Z1a of the transparent plate 31. The fill factor of the guided-mode resonance structure 32a is in a range from about 0.3 to 0.5, and the pitch of the guided-mode resonance structure 32a is in a range from 240 nm to 300 nm. The guided-mode resonance structure 32a blocks a first waveband of the light beam from passing through (or from falling on the sensing structure 20). In some embodiments, the first waveband is in a range from about 430 nm to 480 nm. The first waveband corresponds to a blue component (visible component) of the light beam. In some embodiments, the first waveband corresponds to an ultraviolet component of the light beam.

The guided-mode resonance structure 32b is disposed on an area Z1b of the transparent plate 31. The fill factor of the guided-mode resonance structure 32b is in a range from about 0.3 to 0.5, and the pitch of the guided-mode resonance structure 32a is in a range from 320 nm to 380 nm. The guided-mode resonance structure 32b blocks a second waveband of the light beam from passing through (or from falling on the sensing structure 20). In some embodiments, the second waveband is in a range from about 510 nm to 570 nm. The second waveband corresponds to a green component (visible component) of the light beam.

The guided-mode resonance structure 32c is disposed on an area Z1c of the transparent plate 31. The fill factor of the guided-mode resonance structure 32c is in a range from about 0.3 to 0.5, and the pitch of the guided-mode resonance structure 32a is in a range from 400 nm to 460 nm. The guided-mode resonance structure 32c blocks a third waveband of the light beam from passing through (or from falling on the sensing structure 20). In some embodiments, the third waveband is in a range from about 620 nm to 670 nm. The third waveband corresponds to red component (visible component) of the light beam. In some embodiments, the third waveband corresponds to an infrared component of the light beam.

The anti-reflection layer 33 is disposed on a clear area Z2 of the transparent plate 31. The anti-reflection layer 33 allows the light beam to pass through (or to the sensing structure 20). In other words, the anti-reflection layer 33 does not block a predetermined range of wavelengths of the light beam from passing through (or from falling on the sensing structure 20).

The sensing units 212 under the area Z1a generate first intensity signals according to the light beam passing through the guided-mode resonance structure 32a. The first intensity signals correspond to the first waveband of the light beam. The sensing units 212 under the area Z1b generate second intensity signals according to the light beam passing through the guided-mode resonance structure 32b. The second intensity signals correspond to the second waveband of the light beam.

The sensing units 212 under the area Z1c generate third intensity signals according to the light beam passing through the guided-mode resonance structure 32c. The third intensity signals correspond to the third waveband of the light beam. The sensing units 212 under the clear area Z2 generate reference-intensity signals according to the light beam passing through the clear area Z2 of the transparent plate 31. The reference-intensity signals correspond to all wavebands of the light beam.

The process module 50 is electrically connected to the sensing units 212. The process module 50 receives the first intensity signals, and generates first intensity values according to the intensity of the first intensity signals. The process module 50 receives the second intensity signals, and generates second intensity values according to the intensity of the second intensity signals.

The process module 50 receives the third intensity signals, and generates third intensity values according to the intensity of the third intensity signals. The process module 50 receives the reference-intensity signals, and generates reference-intensity values according to the intensity of the reference-intensity signals.

The process module 50 obtains a first color value according to the first intensity signal and the reference-intensity signal. In some embodiments, the first color value is obtained by the reference-intensity signal minus the first intensity signal. In this embodiment, the first color value corresponds to the blue component of the light beam. In some embodiments, the first color value corresponds to the ultraviolet component of the light beam.

The process module 50 obtains a second color value according to the second intensity signal and the reference-intensity signal. In some embodiments, the second color value is obtained by the reference-intensity signal minus the second intensity signal. In this embodiment, the second color value corresponds to the green component of the light beam.

The process module 50 obtains a third color value according to the third intensity signal and the reference-intensity signal. In some embodiments, the third color value is obtained by the reference-intensity signal minus the third intensity signal. In this embodiment, the third color value corresponds to the red component of the light beam. In some embodiments, the third color value corresponds to the infrared component of the light beam.

Therefore, a pixel value of a pixel of the image is obtained by the process module 50 according to the first color value, the second color value, and the third color value.

Accordingly, the image sensor 1 can be a spectrometer, for example, since the infrared component, the ultraviolet component, and/or the visible component of the light beam can be detected. In some embodiments, the image sensor 1 can be a camera by adjusting the guided-mode resonance structures 32 corresponding to the visible wavebands of the light beam.

Moreover, the manufacturing cost of the sensing structure 20 can be decreased and the structure of the sensing structure 20 can be simplified, since the color filter units disposed on the sensing layer can be omitted.

Figure 4:
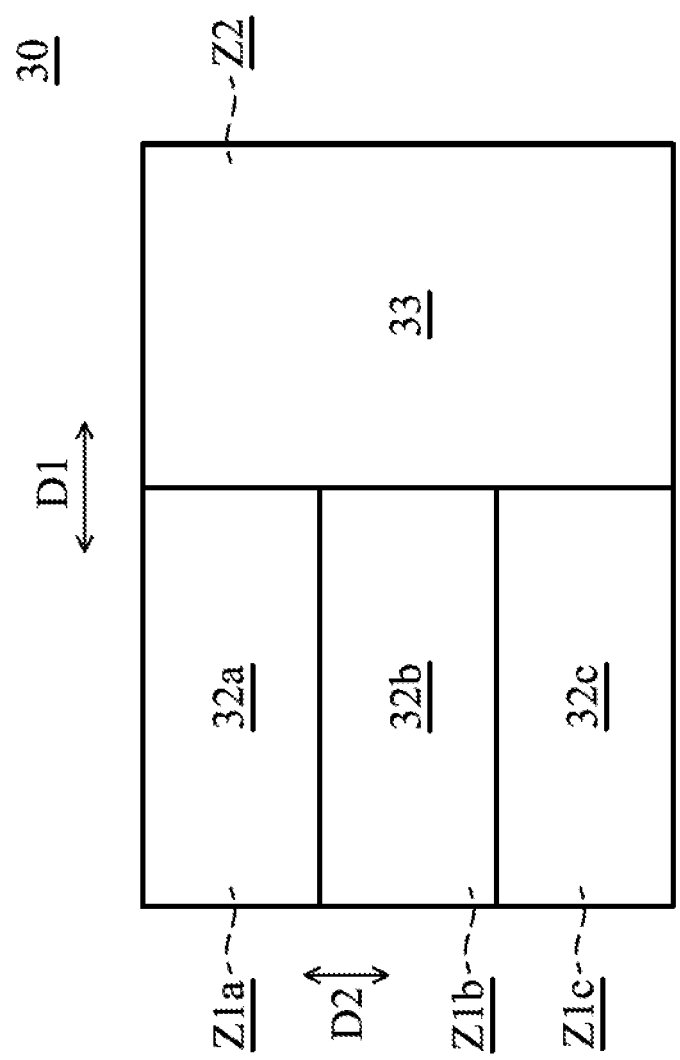
FIG. 4 is a schematic view of a portion of a protection structure in accordance with some embodiments of the present disclosure.

FIG. 4 is a schematic view of a portion of a protection structure 30 in accordance with some embodiments of the present disclosure. The portion of the protection structure 30 corresponds to a pixel of the image. In some embodiments, the guided-mode resonance structures 32a, 32b, and 32c are alternately arranged along an arrangement direction D2.

The anti-reflection layer 33 is located at a side of the guided-mode resonance structures 32a, 32b, and 32c. In other words, the anti-reflection layer 33 is connected or adjacent to the same side of the guided-mode resonance structures 32a, 32b, and 32c.

In addition, the areas Z1a, Z1b, and Z1c are arranged along the arrangement direction D2. The clear area Z2 is located at a side of the areas Z1a, Z1b, and Z1c.

Figure 5:
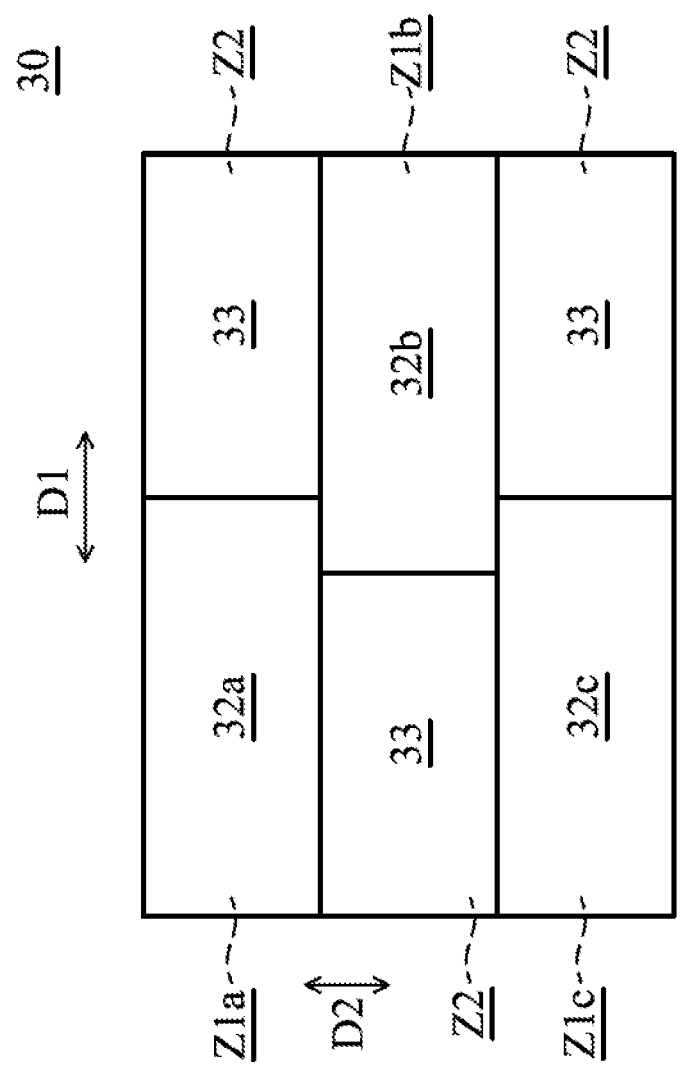
FIG. 5 is a schematic view of a portion of a protection structure in accordance with some embodiments of the present disclosure.

FIG. 5 is a schematic view of a portion of a protection structure 30 in accordance with some embodiments of the present disclosure. The portion of the protection structure 30 corresponds to a pixel of the image. In some embodiments, the guided-mode resonance structures 32a and the anti-reflection layers 33 are alternately arranged along an arrangement direction D1.

In some embodiments, the guided-mode resonance structures 32b and the anti-reflection layers 33 are alternately arranged along the arrangement direction D1. In some embodiments, the guided-mode resonance structures 32b and the anti-reflection layers 33 are alternately arranged along the arrangement direction D1.

One edge of the guided-mode resonance structures 32a, one edge of the guided-mode resonance structures 32b, and one edge of the guided-mode resonance structures 32c are overlapped in the arrangement direction D2.

Figure 6:
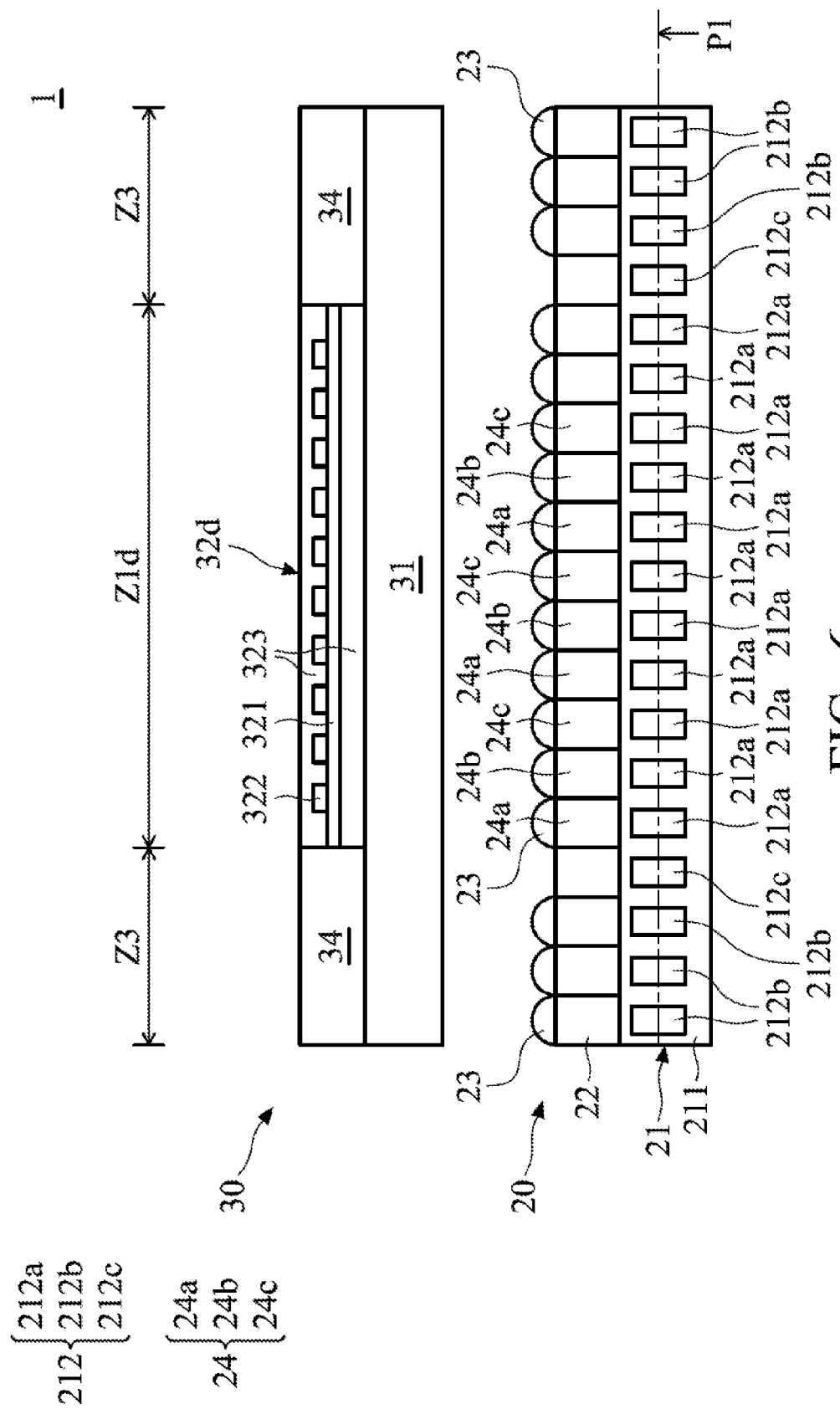
FIG. 6 is a schematic view of the image sensor in accordance with some embodiments of the present disclosure.
Figure 7:
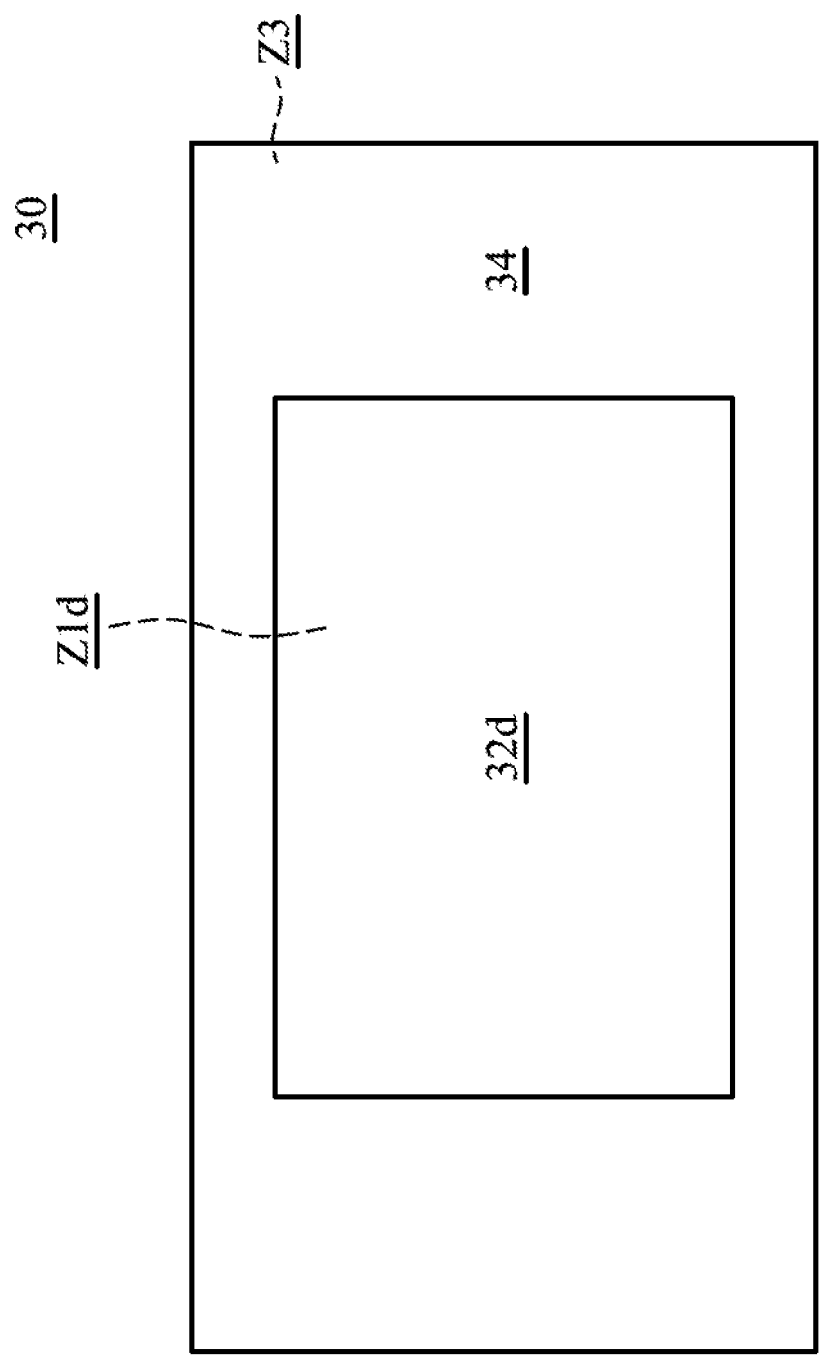
FIG. 7 is a top view of a protection structure in accordance with some embodiments of the present disclosure.

FIG. 6 is a schematic view of an image sensor 1 in accordance with some embodiments of the present disclosure. FIG. 7 is a top view of a protection structure 30 in accordance with some embodiments of the present disclosure. In some embodiments, the area Z1d is located in the center of the transparent plate 31. The guided-mode resonance structure 32d is disposed on the area Z1. The fill factor of the guided-mode resonance structure 32 d is in a range from about 0.5 to 0.8.

The guided-mode resonance structure 32d blocks a fourth waveband of the light beam from passing through. In some embodiments, the fourth waveband is in a range from about 800 nm to 1000 nm. The fourth waveband corresponds to an infrared ray of the light beam.

The protection structure 30 includes a top color filter unit 34 disposed on a color filter area Z3 of the transparent plate 31. The color filter area Z3 is surrounding the area Z1d. In some embodiments, the color filter area Z3 is located at the edges of the transparent plate 31.

The top color filter unit 34 allows a predetermined range of wavelengths of light to pass through (or to the sensing units 212b). In some embodiments, the top color filter unit 34 allows wavelengths of light in a range from 800 nm to 1000 nm (infrared ray) to pass through.

The sensing structure 20 further includes color filter units 24. As shown in FIG. 6, the flat layer 22 under the area Z1d of the transparent plate 31 is replaced by the color filter units 24.

The color filter units 24 are disposed on the sensing layer 21, and under the area Z1d of the transparent plate 31. In some embodiments, the color filter units 24 are located between the sensing layer 21 and the microlenses 23. The color filter units 24 are arranged in a filter array along a plane parallel to the reference plane P1. Each of the color filter units 24 is disposed over one of the sensing units 212a.

Each of the color filter units 24 allows a predetermined range of wavelengths of light to pass through (or to the sensing units 212a). In some embodiments, the color filter units 24 are color filter units. The color filter units 24 include red color filter units 24a, green color filter units 24b, and blue color filter units 24c. The red color filter units 24a, the green color filter units 24b, and the blue color filter units 24c are alternately arranged in the filter array.

The red filter unit 24a mainly allows wavelengths of the light beam in a range from 580 nm to 750 nm (red light) to pass through to the sensing unit 212a. The green filter unit 24b mainly allows wavelengths of the light beam in a range from 450 nm to 620 nm (green light) to pass through to the sensing unit 212a. The blue filter unit 24c mainly allows wavelengths of the light beam in a range from 400 nm to 520 nm (blue light) to pass through to the sensing unit 212a.

As shown in FIG. 6, the flat layer 22 is disposed on the sensing layer 21, and under the top color filter unit 34. The microlenses 23 are disposed on the flat layer 22 and under the color filter area Z3. The flat layer 22 is surrounding the color filter units 24. In some embodiments, the flat layer 22 is in direct contact with color filter units 24. The flat layer 22 and the color filter units 24 are arranged along a plane that is parallel to the reference plane P1.

The sensing units 212c between the sensing units 212a and 212b are dummy sensing units. As shown in FIG. 6, only one sensing unit 212c between the sensing units 212a and 212b are shown. However, in some embodiments, there are at least two sensing units 212c between the sensing units 212a and 212b. In other words, the sensing units 212c do not generate any intensity signals. In addition, there are no microlenses 23 over the sensing units 212c. Therefore, the intensity signal generated by the sensing units 212a may not be influenced by the light beam passing through the top color filter unit 34. The intensity signal generated by the sensing units 212b may not be influenced by the light beam passing through the guided-mode resonance structure 32d.

In this embodiment, since the top color filter unit 34 allows infrared rays to pass through, the sensing units 212b can generate intensity signals according to the infrared ray falling thereon. Therefore, the image sensor 1 can be used to detect gestures or TOF application.

In addition, since the color filter units 24 are disposed on the sensing units 212a, an image can be captured according the intensity signals generated by the sensing units 212a. Moreover, since the guided-mode resonance structure 32d blocks infrared rays, the image is not affected by the infrared ray. Accordingly, in this embodiment, the image sensor 1 provides the multiple functionality of image capture and gesture detecting.

In conclusion, because of the structure of the guided-mode resonance structure, the color filter units disposed on the sensing layer can be omitted. Therefore, the manufacturing cost of the sensing structure is decreased and the structure of the sensing structure can be simplified. In addition, because of the guided-mode resonance structure and the top color filter unit, the image sensor can be designed to perform multiple functions, such as image capture and gesture detection.

The disclosed features may be combined, modified, or replaced in any suitable manner in one or more disclosed embodiments, but are not limited to any particular embodiments.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image sensor, comprising:
   a sensing layer comprising a plurality of sensing units configured to sense a light beam;
   a transparent plate located above the sensing layer;
   a first guided-mode resonance structure, disposed on a first area of the transparent plate, blocking a first waveband of the light beam from passing through;
   a top color filter unit disposed on a color filter area of the transparent plate;
   a flat layer, disposed on the sensing layer, under the top color filter unit;
   a plurality of microlenses, disposed on the flat layer, under the color filter area; and
   a plurality of color filter units disposed on the sensing layer, under the first area of the transparent plate.

2. The image sensor as claimed in claim 1, further comprising a second guided-mode resonance structure, disposed on a second area of the transparent plate, blocking a second waveband of the light beam from passing through.

3. The image sensor as claimed in claim 1, further comprising an anti-reflection layer disposed on a clear area of the transparent plate.

4. The image sensor as claimed in claim 1, wherein the first guided-mode resonance structure comprises:
   a base layer;
   a plurality of grating units disposed on the base layer; and
   a transparent material disposed on the base layer and the grating units.

5. An image capturing device, comprising:
   a sensor housing comprising a receiving chamber, and an opening communicating with the receiving chamber;
   a sensing structure, disposed in the receiving chamber, comprising a sensing layer comprising a plurality of sensing units configured to sense a light beam; and a protection structure, comprising:
   a transparent plate covering the opening, and located above the sensing structure; and a first guided-mode resonance structure, disposed on a first area of the transparent plate, blocking a first waveband of the light beam from passing through,
   the protection structure further comprises a top color filter unit disposed on a color filter area of the transparent plate;
   the sensing structure further comprises:
   a flat layer, disposed on the sensing layer, under the color filter area; and a plurality of microlenses, disposed on the flat layer, under the color filter area of the transparent plate.
   a plurality of color filter units disposed on the sensing layer, under the first area of the transparent plate.

6. The image capture device as claimed in claim 5, further comprising:
   a lens housing, disposed on the sensor housing; and
   a lens assembly disposed in the lens housing.

7. The image capture device as claimed in claim 5, wherein the protection structure further comprises a second guided-mode resonance structure, disposed on a second area of the transparent plate, blocking a second waveband of the light beam from passing through.

8. The image capture device as claimed in claim 5, wherein the protection structure further comprises an anti-reflection layer disposed on a clear area of the transparent plate.

9. The image capture device as claimed in claim 5, wherein the first guided-mode resonance structure comprises:
   a base layer;
   a plurality of grating units disposed on the base layer; and
   a transparent material disposed on the base layer and the grating units.

10. The image capture device as claimed in claim 5, wherein the sensing structure further comprises:
    a flat layer disposed on the sensing layer; and
    a plurality of microlenses disposed on the flat layer.

* * * * *